United States Patent
Shiozaki et al.

(10) Patent No.: US 10,804,615 B2
(45) Date of Patent: Oct. 13, 2020

(54) RADAR DEVICE

(71) Applicant: Panasonic Intellectual Property Management Co., Ltd., Osaka (JP)

(72) Inventors: Ryosuke Shiozaki, Tokyo (JP); Tomohiro Yui, Kanagawa (JP); Ken Takahashi, Ishikawa (JP); Yuichi Kashino, Ishikawa (JP); Kouji Suzuki, Kanagawa (JP); Noriaki Saito, Tokyo (JP); Shigeki Nakamura, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 223 days.

(21) Appl. No.: 16/198,911

(22) Filed: Nov. 23, 2018

(65) Prior Publication Data
US 2019/0165482 A1 May 30, 2019

(30) Foreign Application Priority Data

Nov. 27, 2017  (JP) ................. 2017-226995
Oct. 11, 2018   (JP) ................. 2018-192850

(51) Int. Cl.
*G01S 7/03* (2006.01)
*H01Q 19/06* (2006.01)
(Continued)

(52) U.S. Cl.
CPC ............ *H01Q 19/06* (2013.01); *G01S 7/032* (2013.01); *G01S 13/931* (2013.01);
(Continued)

(58) Field of Classification Search
CPC ..... G01S 7/032; G01S 13/931; H01Q 1/3233; H01Q 1/3275; H01Q 1/3283; H01Q 1/42;
(Continued)

(56) References Cited

U.S. PATENT DOCUMENTS 5,905,457 A * 5/1999 Rashid ................. G01S 13/931
342/70
2005/0219126 A1 10/2005 Rebeiz et al.
(Continued)

FOREIGN PATENT DOCUMENTS

EP       840140 A1    5/1998
EP      1462817 A1    9/2004
(Continued)

OTHER PUBLICATIONS

The Extended European Search Report dated Apr. 8, 2019 for the related European Patent Application No. 18207928.5.
(Continued)

*Primary Examiner* — Harry K Liu
(74) *Attorney, Agent, or Firm* — Seed IP Law Group LLP

(57) ABSTRACT

A radar device includes: a case having an opening at the front in a forward direction, which is a transmission direction of electromagnetic waves; a circuit board placed in the case, the circuit board having first and second circuit board parts, one component side of the first circuit board part facing in the forward direction, the component sides of the second circuit board part extending along the forward direction; a transmission antenna and reception antenna composed of a plurality of antenna elements placed into an array in a direction crossing the forward direction in an area, facing in the forward direction, on the circuit board; and a dielectric lens having a semi-cylindrical or parabolic cylindrical shape in the forward direction, the dielectric lens being placed in the opening in the case so as to extend along a direction in which the plurality of antenna elements are placed into an array.

16 Claims, 13 Drawing Sheets

(51) Int. Cl.

| | |
|---|---|
| *G01S 13/931* | (2020.01) |
| *H01Q 1/32* | (2006.01) |
| *H01Q 21/08* | (2006.01) |
| *H01Q 15/08* | (2006.01) |
| *H01Q 1/42* | (2006.01) |
| *H01Q 3/34* | (2006.01) |
| *H01Q 9/04* | (2006.01) |
| *H01Q 19/10* | (2006.01) |
| *H05K 1/02* | (2006.01) |
| *H05K 1/18* | (2006.01) |
| *H05K 7/14* | (2006.01) |
| *G01S 7/02* | (2006.01) |

(52) U.S. Cl.
CPC ......... *H01Q 1/3233* (2013.01); *H01Q 1/3275* (2013.01); *H01Q 1/3283* (2013.01); *H01Q 1/42* (2013.01); *H01Q 3/34* (2013.01); *H01Q 9/0407* (2013.01); *H01Q 15/08* (2013.01); *H01Q 19/062* (2013.01); *H01Q 19/10* (2013.01); *H01Q 21/08* (2013.01); *H05K 1/0243* (2013.01); *H05K 1/181* (2013.01); *H05K 7/1427* (2013.01); *G01S 2007/027* (2013.01); *G01S 2013/9327* (2020.01); *G01S 2013/93273* (2020.01); *H05K 2201/10098* (2013.01); *H05K 2201/10545* (2013.01)

(58) Field of Classification Search
CPC .......... H01Q 3/34; H01Q 3/26; H01Q 3/2605; H01Q 3/36; H01Q 3/22; H01Q 9/0407; H01Q 15/08; H01Q 19/062; H01Q 19/10; H01Q 21/08; H01Q 25/00

USPC ........................................................ 342/372
See application file for complete search history.

(56) References Cited

U.S. PATENT DOCUMENTS

| | | | |
|---|---|---|---|
| 2010/0231436 A1* | 9/2010 | Focke | ................... G01S 13/931 342/70 |
| 2012/0146882 A1* | 6/2012 | Binzer | ................. H01Q 19/062 343/911 R |
| 2015/0207236 A1 | 7/2015 | Felic et al. | |
| 2015/0229023 A1 | 8/2015 | Abe et al. | |
| 2017/0167865 A1* | 6/2017 | Welle | ....................... H04Q 9/00 |
| 2017/0324171 A1* | 11/2017 | Shehan | .................. H01Q 1/246 |
| 2018/0267138 A1* | 9/2018 | Sakurai | .................. H01Q 15/08 |

FOREIGN PATENT DOCUMENTS

| | | |
|---|---|---|
| EP | 1677126 A1 | 7/2006 |
| JP | 2008-503904 | 2/2008 |
| WO | 2005/094352 | 10/2005 |
| WO | 2006/035510 A1 | 4/2006 |

OTHER PUBLICATIONS

The Extended European Search Report dated Apr. 8, 2019 for the related European Patent Application No. 18207925.1.
European Office Action dated Apr. 7 2020 for the related European Patent Application No. 18207928.5, 7 pages.
European Office Action dated Apr. 22, 2020 for the related European Patent Application No. 18207925.1, 7 pages.

* cited by examiner

FIG. 1
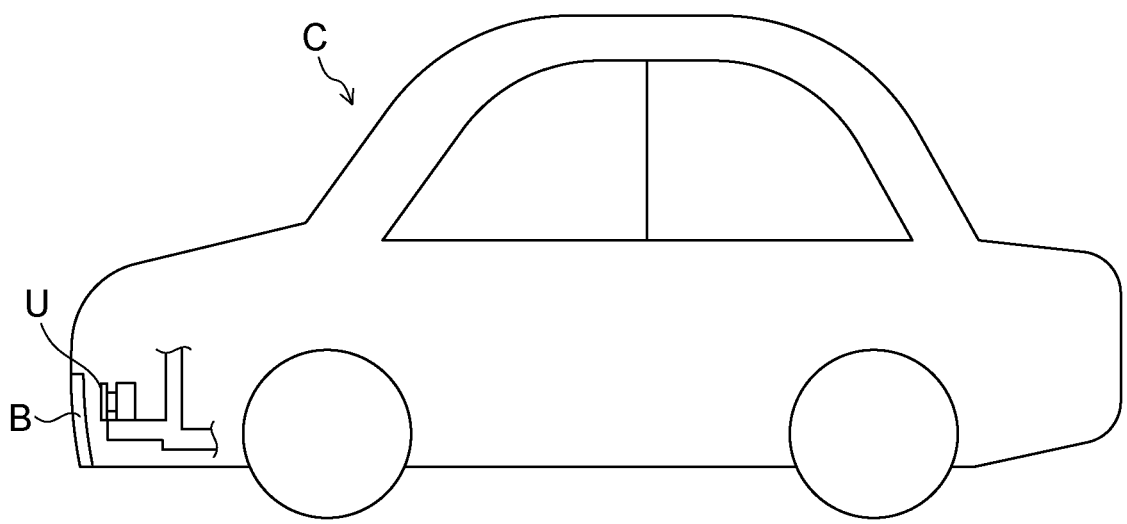
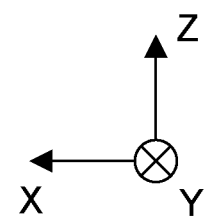

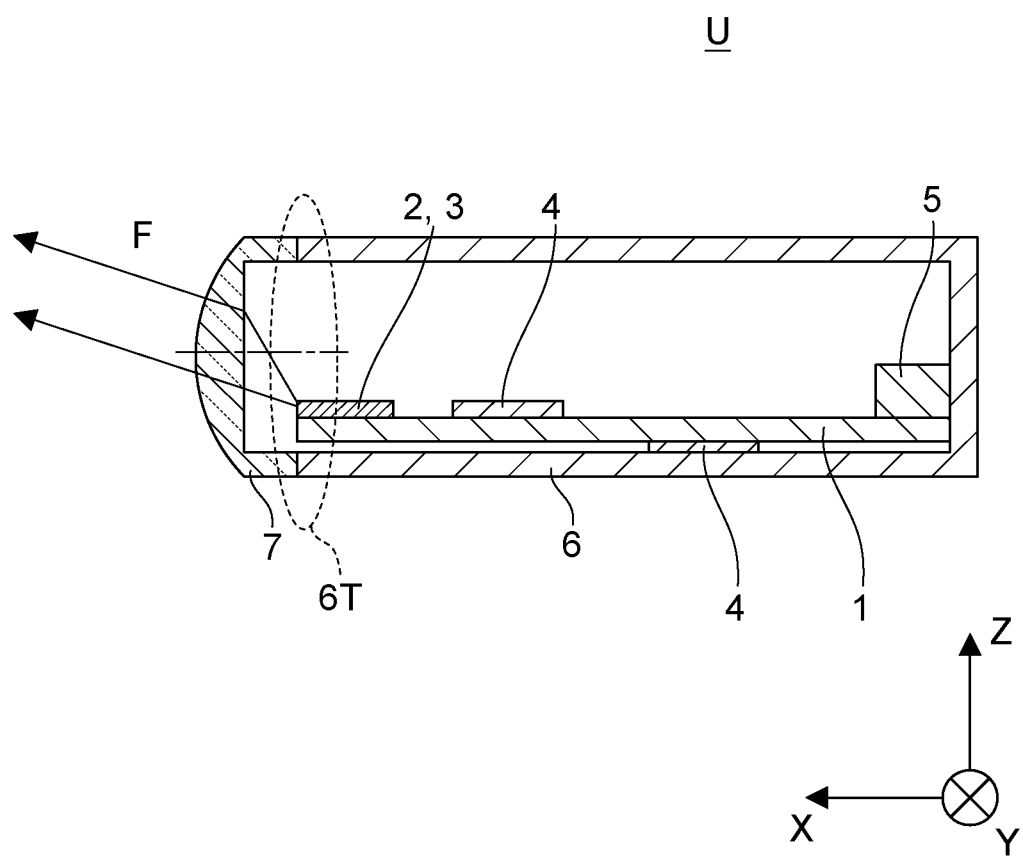

RADAR DEVICE

BACKGROUND

1. Technical Field

The present disclosure relates to a radar device.

2. Description of the Related Art

A known radar device for radar use detects the position of an object (also referred to below as the target) in a non-contact manner by using electromagnetic waves in a frequency band for extremely high frequency waves and microwaves.

A radar device is mounted in, for example, a vehicle for monitoring in various directions including forward monitoring, side monitoring in the forward direction, and side monitoring in the backward direction.

SUMMARY

In recent years, to reduce space in which to mount a radar device of the above type, assure flexibility for a position at which to mount the radar device, or for other purposes, a horizontally mounted radar device is being studied in which a circuit board on which an antenna section is mounted is placed in parallel to a direction in which electromagnetic waves are sent.

In Japanese Unexamined Patent Application Publication (Translation of PCT Application) No. 2008-503904, for example, a plurality of end-fire antennas oriented in mutually different directions are radially placed on a circuit board to achieve both horizontal mounting and detection of an object in a wide range.

However, the radar device described in Japanese Unexamined Patent Application Publication (Translation of PCT Application) No. 2008-503904 is problematic in that the transmission directions of electromagnetic waves are restricted by the direction in which each end-fire antenna is oriented and bearing discrimination in object detection is thereby inadequate. Another problem with the radiator device described in Japanese Unexamined Patent Application Publication (Translation of PCT Application) No. 2008-503904 is that it is hard to assure an antenna gain.

One non-limiting and exemplary embodiment provides a radar device that can achieve a high antenna gain and high bearing discrimination in spite of the radar device being horizontally mounted.

In one general aspect, the techniques disclosed here feature a radar device that has: a case having an opening at the front of the case in a forward direction, which is a transmission direction of electromagnetic waves; a circuit board placed in the case, the circuit board having a first circuit board part and a second circuit board part, one component side of the first circuit board part being oriented in the forward direction, the component sides of the second circuit board part extending along the forward direction; an antenna section composed of a plurality of antenna elements placed on the one component side, oriented in the forward direction, of the first circuit board part, the plurality of antenna elements being placed into an array in a direction crossing the forward direction, the antenna section sending electromagnetic waves to the outside of the case through the opening, the antenna section receiving reflected waves of the electromagnetic waves; and a dielectric lens that is a semi-cylindrical or parabolic cylindrical lens having a convex shape in the forward direction, the dielectric lens being placed in the opening in the case so as to extend along a direction in which the plurality of antenna elements are placed into an array.

The radar device according to the present disclosure can achieve a high antenna gain and high bearing discrimination in spite of the radar device being horizontally mounted.

Additional benefits and advantages in one aspect of the present disclosure will become apparent from the specification and drawings. The benefits and/or advantages may be individually obtained by some embodiments and features described in the specification and drawings, which need not all be provided in order to obtain one or more of such benefits and/or advantages.

BRIEF DESCRIPTION OF THE DRAWINGS

FIG. 1 illustrates an example of a state in which a radar device according to a first embodiment is placed in a vehicle;

FIG. 13 is a sectional side elevation illustrating another structure of the radar device according to the seventh embodiment.

DETAILED DESCRIPTION

Figure 2:
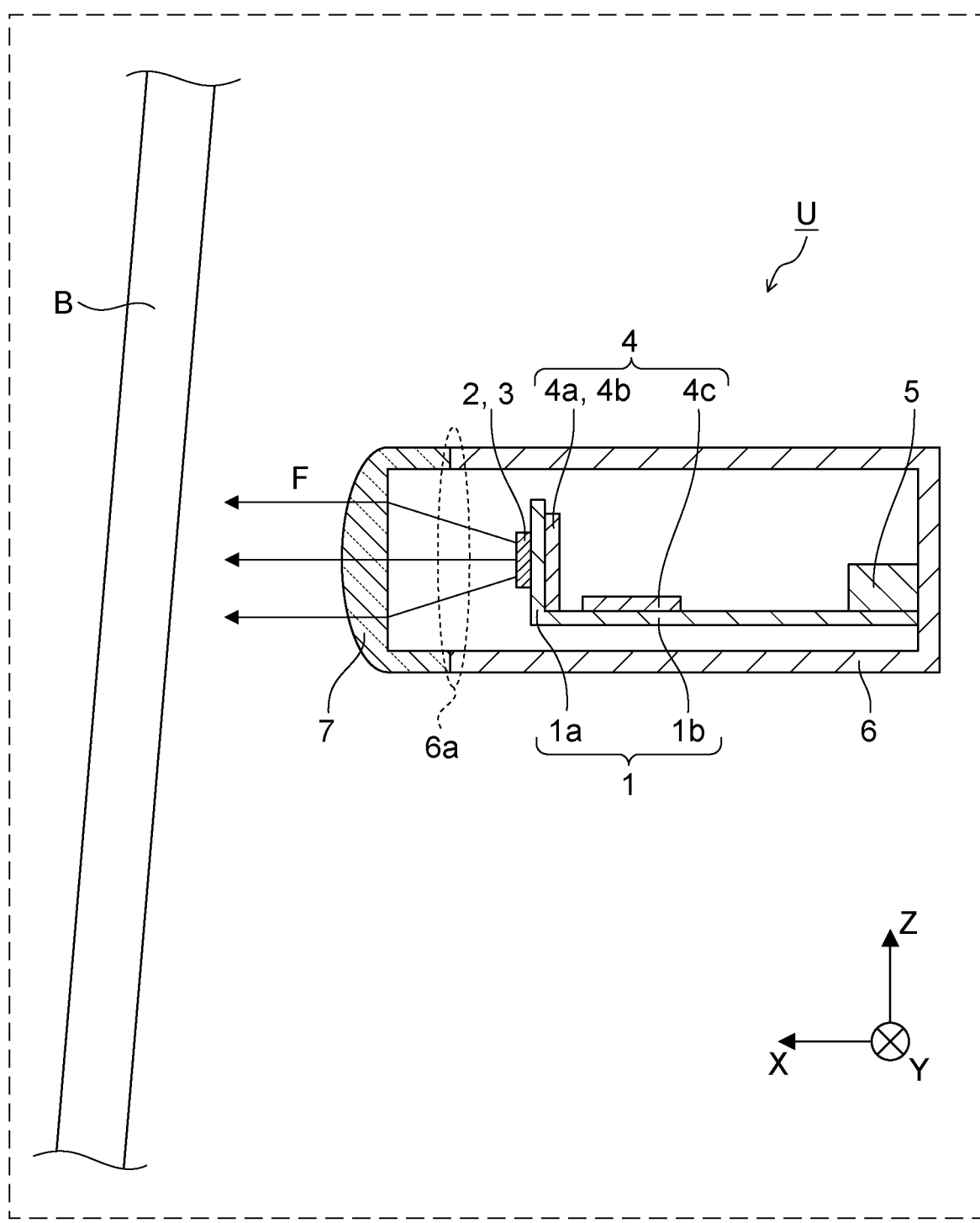
FIG. 2 is a sectional side elevation of the radar device according to the first embodiment.

Embodiments of the present disclosure will be described below in detail with reference to the drawings. In the specification and drawings, the essentially same constituent elements are denoted by the same reference characters and repeated descriptions will be omitted.

In all drawings, to clarify positional relationships among constituent elements, a common orthogonal coordinate system (X, Y, Z) is indicated with respect to a forward direction in which the radar device sends electromagnetic waves to the outside of the radar device (that is, a direction in which an object is detected). In the descriptions below, the positive direction of the X-axis represents the forward direction in which the radar device sends electromagnetic waves to the outside of the radar device (the direction will be simply referred to below as the forward direction), the positive direction of the Y-axis represents the right-side direction of the radar device, and the positive direction of the Z-axis represents the upward direction of the radar device (the direction will be simplify referred to below as the upward direction).

First Embodiment

An example of a radar device according to this embodiment will be described below with reference to FIGS. 1 to 5. In the descriptions below, a radar device mounted in a vehicle will be taken as an example of the radar device in the present disclosure.

FIG. 1 illustrates an example of a state in which the radar device U according to this embodiment is placed in a vehicle.

The radar device U according to this embodiment is placed, for example, inside a cover member B of a vehicle C (in this example, the cover member B is a bumper member). The radar device U sends and receives electromagnetic waves through the cover member B.

Figure 3:
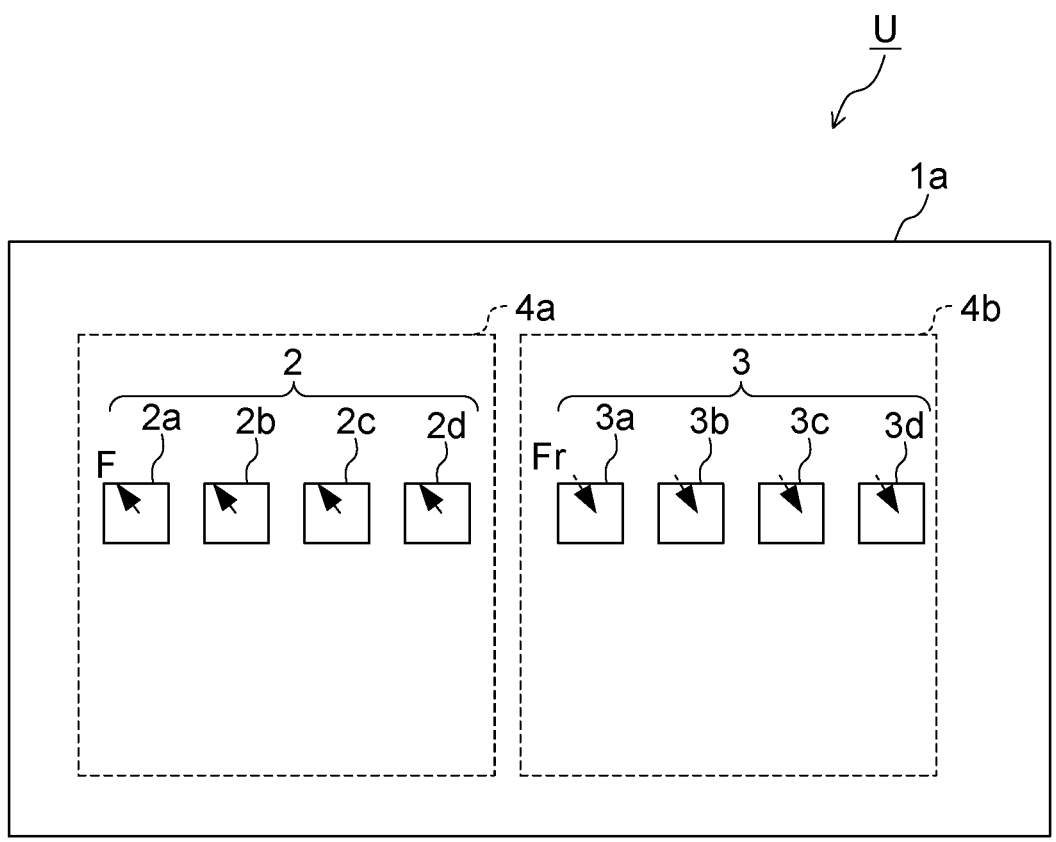
FIG. 3 is a front view of the radar device according to the first embodiment.
Figure 4:
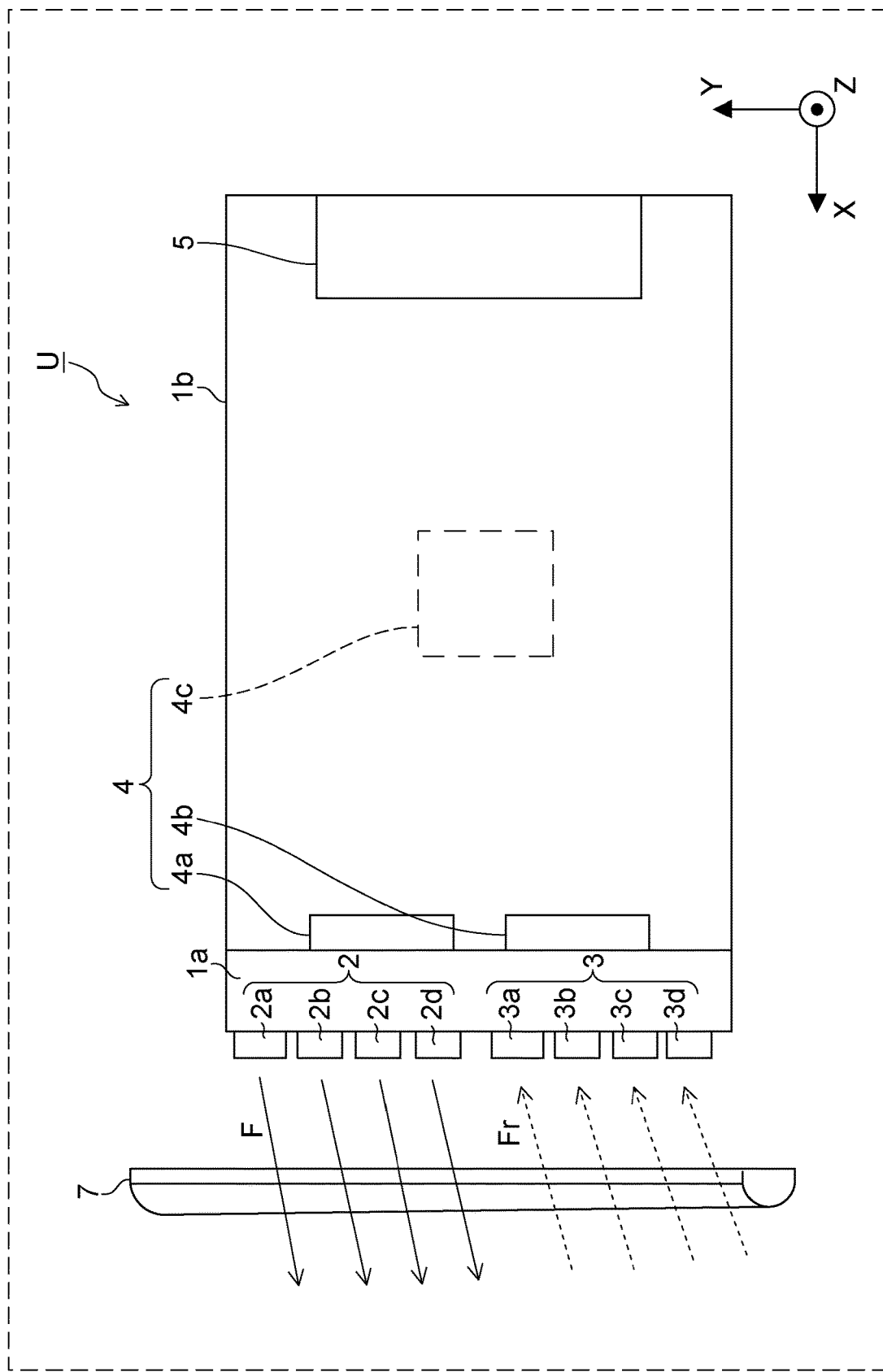
FIG. 4 is a plan view of the radar device according to the first embodiment.

FIG. 2 is a sectional side elevation of the radar device U according to this embodiment. FIG. 3 is a front view of the radar device U according to this embodiment when the front component side of a first circuit board part 1a, which will be described later, is viewed from in front of the first circuit board part 1a). FIG. 4 is a plan view of the radar device U according to this embodiment.

Each arrow F indicated by a solid line in FIGS. 2, 3, and 4 represents an electromagnetic wave sent from a transmission antenna. Each arrow Fr indicated by a dotted line in FIGS. 3 and 4 represents a reflected wave from a target. In FIGS. 2, 3, and 4, a structure that supports the radar device U in the vehicle C is not illustrated. In FIG. 3, a case 6, which will be described later, is not illustrated.

The radar device U according to this embodiment has a circuit board 1, a transmission antenna 2, a reception antenna 3, a signal processing IC 4, a connector 5, the case 6, and a dielectric lens 7.

On the circuit board 1, the transmission antenna 2, reception antenna 3, signal processing IC 4, connector 5, and the like are mounted. Specifically, on the front or rear component side of the circuit board 1, the transmission antenna 2, reception antenna 3, signal processing IC 4, connector 5, and the like are mounted, and wires (not illustrated) that electrically connect these components (transmission antenna 2, reception antenna 3, signal processing IC 4, connector 5, and the like) to one another are formed as patterns.

The circuit board 1 has the first circuit board part 1a placed so that its component sides extend in the up-down direction (substantially in the Z-axis direction) and one of these component sides faces the front, and also has a second circuit board part 1b placed so that its component sides extend in the front-back direction (substantially in the X-axis direction). That is, the first circuit board part 1a is placed so that one component side of it opposes the cover member B, and the second circuit board part 1b is placed so that the direction in which its component sides extend crosses (for example, is orthogonal to) the direction in which the cover member B extends.

On the first circuit board part 1a, the transmission antenna 2 and reception antenna 3 are placed (in this example, signal processing ICs 4a and 4b for use in an extremely high frequency band are further placed), as illustrated in FIG. 3. On the second circuit board part 1b, circuit components (not illustrated) other than the transmission antenna 2 and reception antenna 3 (in this example, these components are a signal processing IC 4c for use in a baseband, the connector 5, an electrolytic capacitor, and the like) are placed. The second circuit board part 1b and first circuit board part 1a are electrically connected to each other with wires (not illustrated).

That is, in the radar device U according to this embodiment, since the circuit board 1 is composed of the first circuit board part 1a and second circuit board part 1b, an area occupied by the radar device U in the Y-axis direction (that is, the area of each component side of the first circuit board part 1a) is reduced to a minimum area needed to place only the transmission antenna 2 and reception antenna 3. This enables a horizontally mounted radar device to be implemented.

The first circuit board part 1a and the second circuit board part 1b have a positional relationship in which the first circuit board part 1a is closer to the front than is the midpoint of the component sides of the second circuit board part 1b in the front-back direction. When the transmission antenna 2 sends electromagnetic waves and when the reception antenna 3 receives the electromagnetic waves, therefore, it is possible to prevent these electromagnetic waves from being shielded by circuit parts mounted on the second circuit board part 1b.

There is no limitation on the materials of the first circuit board part 1a and second circuit board part 1b of the circuit board 1 if the materials are rigid circuit board materials. For example a flat printed circuit board (PCB) can be used. A multi-layer circuit board or a semiconductor circuit board in which the signal processing IC 4 is incorporated may be used as the first circuit board part 1a and second circuit board part 1b. If the second circuit board part 1b and first circuit board part 1a are electrically connected to each other, they may be formed integrally or as separate components.

The transmission antenna 2 is placed on the front component side of the first circuit board part 1a. The transmission antenna 2 sends electromagnetic waves forward (in the positive X direction). The reception antenna 3 is placed on the front component side of the first circuit board part 1a. The reception antenna 3 receives reflected waves from in front of the circuit board 1 (in the positive X direction). That is, in transmission and reception, the transmission antenna 2 and the reception antenna 3 each have a directivity property in a direction substantially normal to the component sides of the first circuit board part 1a.

The transmission antenna 2 and reception antenna 3 are each composed of a plurality of antenna elements placed into an array on a component side of the first circuit board part 1a along the Y-axis direction (in FIG. 3, the transmission antenna 2 is composed of four antenna elements, denoted 2a, 2b, 2c, and 2d, placed along the Y-axis direction, and the reception antenna 3 is composed of four antenna elements, denoted 3a, 3b, 3c, and 3d, placed along the Y-axis direction). That is, the transmission antenna 2 and reception antenna 3 are each formed as a phased array antenna that changes a direction in which electromagnetic waves are sent and received by electronic scanning.

Patch antennas having a directivity property in a direction normal to the component sides of the first circuit board part 1a, for example, are used as the antenna elements 2a, 2b, 2c, and 2d constituting the transmission antenna 2 and as the antenna elements 3a, 3b, 3c, and 3d constituting the reception antenna 3. Many antenna elements can be placed on a component side if they have a directivity property in the direction normal to the component side as with patch antennas. When these antenna elements are used, therefore, a high gain can be obtained (in this embodiment, only the antenna elements 2a to 2d and 3a to 3d are indicated for convenience of explanation).

The transmission antenna 2 and reception antenna 3 only need to be structured by using conductive patterns formed on the circuit board 1, so slot antennas and the like can also be used as the transmission antenna 2 and reception antenna 3.

In the description below, the transmission antenna 2 and reception antenna 3 will be collectively referred to as the antenna section. The transmission antenna 2 and reception antenna 3 may be formed as a single antenna used for both transmission and reception of electromagnetic waves.

An electromagnetic wave sent from the transmission antenna 2 is converted to a plane wave by the dielectric lens 7 and is then sent toward an outside region in front of the radar device U (in this example, in a substantially horizontal direction). When a reflected wave of the electromagnetic wave sent from the transmission antenna 2 is reflected by a target outside the radar device U and then returns, the reflected wave is focused by the dielectric lens 7 and then propagates to the reception antenna 3. In a wall region of the case 6, the transmission antenna 2 and reception antenna 3 are placed behind an opening 6*a*, through which electromagnetic waves can be transmitted.

The signal processing IC 4 (equivalent to a signal processor in the present disclosure) sends and receives electric signals to and from the transmission antenna 2 and reception antenna 3 to cause the transmission antenna 2 to send electromagnetic waves and to perform processing to receive reflected waves received by the reception antenna 3.

The main component of the signal processing IC 4 is, for example, a known microcomputer composed of a central processing unit (CPU), a read-only memory (ROM), a random-access memory (RAM), and the like. The signal processing IC 4 further includes an oscillator, a signal processing circuit that performs transmission and reception processing, and other components. However, part of the signal processing IC 4 can be implemented by only a special hardware circuit that lacks a CPU and the like. In addition, part of the processing by the signal processing IC 4 may be executed by an external device such as a vehicle engine control unit (ECU).

As an example of the signal processing IC 4, FIGS. 2, 3, and 4 illustrate the signal processing IC 4*a*, for use by the transmission antenna 2, that performs signal processing in an extreme high frequency band, the signal processing IC 4*b*, for use by the reception antenna 3, that performs signal processing in an extreme high frequency band, and the signal processing IC 4*c* that performs signal processing in a baseband, these ICs being separate chips.

The signal processing ICs 4*a* and 4*b* that perform signal processing in an extreme high frequency band are placed on the rear component side of the first circuit board part 1*a* as illustrated in FIGS. 2, 3, and 4 so as to shorten the lengths of wires between the transmission antenna 2 and the signal processing IC 4*a* and between the reception antenna 3 and the signal processing IC 4*b*. The signal processing IC 4*c* that performs signal processing in a baseband may be placed at any position. In FIG. 4, the signal processing IC 4*c* is placed on the front component side of the second circuit board part 1*b*.

Figure 5:
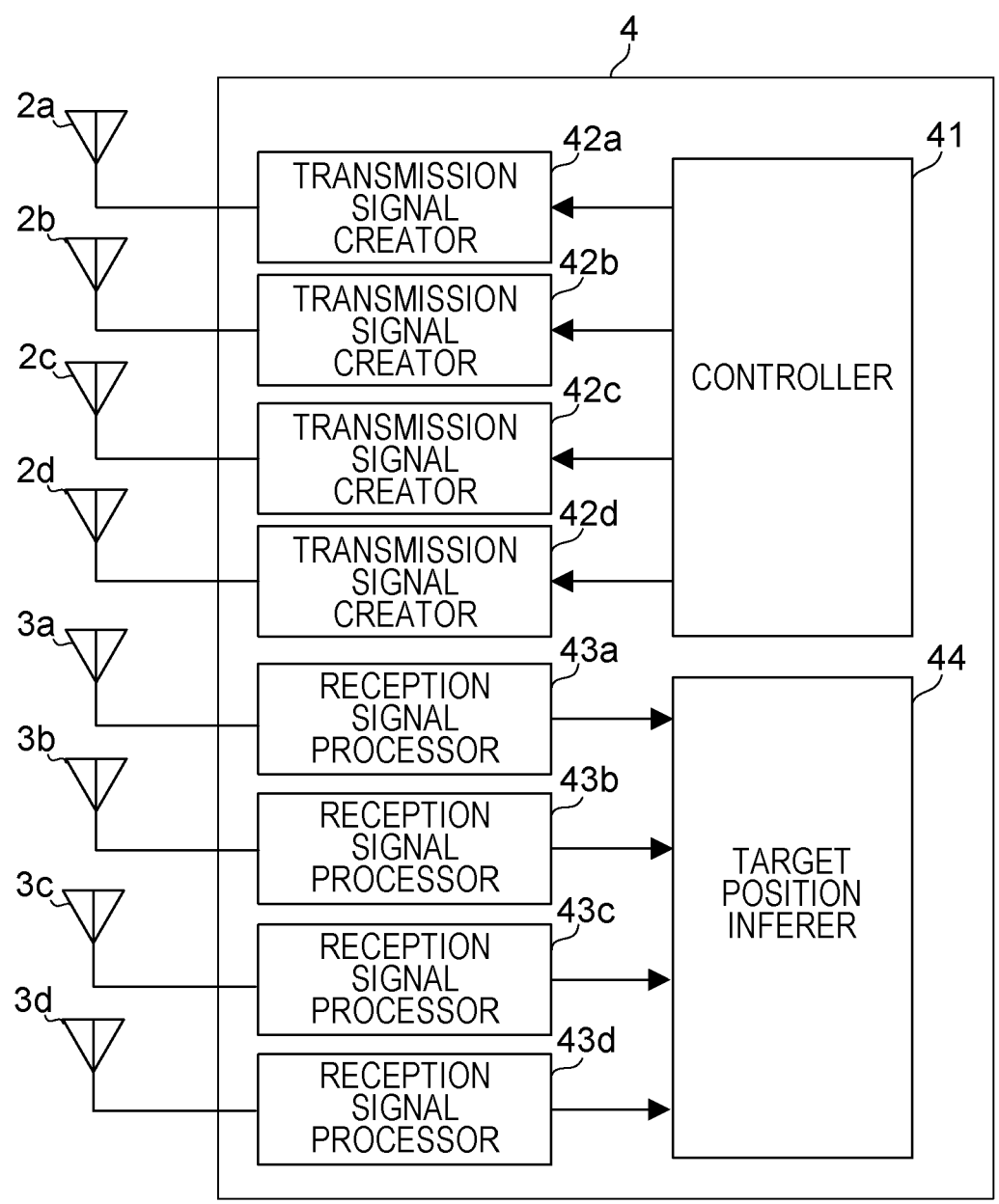
FIG. 5 is a block diagram of a signal processing IC in the radar device according to the first embodiment.

FIG. 5 is a block diagram of the signal processing IC 4 in the radar device U according to this embodiment.

The signal processing IC 4 according to this embodiment is included in a radar device U in, for example, a frequency modulated continuous wave (FW-CW) method. However, the signal processing IC 4 may be included in a radar device U in a pulse radar method.

The signal processing IC 4 has, for example, a controller 41, transmission signal creator 42*a* to 42*d*, which are respectively connected to the antenna elements 2*a* to 2*d* of the transmission antenna 2 on a one-to-one basis, reception signal processors 43*a* to 43*d*, which are respectively connected to the antenna elements 3*a* to 3*d* of the reception antenna 3 on a one-to-one basis, and a target position inferer 44 that acquires, from the reception signal processors 43*a* to 43*d*, reception signals involved in reflected waves from a target, reception processing having been performed on the reflected waves.

The controller 41 controls the operation of the transmission signal creators 42*a* to 42*d*, for example, and controls the direction of electromagnetic waves to be sent from the radar device U to the outside of the radar device U by electronic scanning. The transmission signal creators 42*a* to 42*d* each use, for example, a reference signal acquired from an oscillator to successively create a transmission signal at a high frequency (in a frequency band for extremely high frequency waves, for example) on which frequency modulation has been performed so that the frequency is gradually increased and decreased repeatedly with time. According to the transmission signal, the transmission signal creators 42*a* to 42*d* respectively send the transmission signal to the antenna elements 2*a* to 2*d*, which are respectively connected to the transmission signal creators 42*a* to 42*d*, to cause the antenna elements 2*a* to 2*d* to send an electromagnetic wave that has been frequency-modulated. The transmission signal creators 42*a* to 42*d* each adjust the phase of an electromagnetic wave to be sent from the antenna elements 2*a* to 2*d* to change the direction of an electromagnetic wave to be sent from the radar device U to the outside of the radar device U (that is, a wave resulting from combining the electromagnetic waves sent from the antenna elements 2*a* to 2*d*).

The reception signal processors 43*a* to 43*d* each use a local signal created by the transmission signal creators 42*a* to 42*d* to perform quadrature detection processing, frequency analysis processing, and other processing on a reception signal involved in the reflected wave acquired from the antenna elements 3*a* to 3*d*, which are respectively connected to the reception signal processors 43*a* to 43*d*.

The target position inferer 44 acquires, from the reception signal processors 43*a* to 43*d*, the reception signals involved in the reflected waves, reception processing having been performed on the reception signals, calculates differences among the phases of the reflected waves received at the antenna elements 3*a* to 3*d*, and infers a direction toward the target. At that time, the target position inferer 44 may detect a distance to the target, a relative speed, and the like.

When a direction is inferred in object detection by electronic scanning as described above, bearing discrimination in direction inference can be improved when compared with object detection in which permanently oriented antennas are used as in the related art described in Japanese Unexamined Patent Application Publication (Translation of PCT Application) No. 2008-503904.

Detailed descriptions of processing performed by the signal processing IC 4 will be omitted because the processing is similar to processing performed by a known structure.

The connector 5 connects the signal processing IC 4 and an external device (for example, a vehicle ECU mounted on the vehicle C) together so that communication is possible between them.

The case 6 accommodates the circuit board 1 and supports the dielectric lens 7 in front of the circuit board 1. When the case 6 and dielectric lens 7 are combined together, the circuit board 1 can be accommodated in the case 6 and inside the dielectric lens 7 in, for example, a substantially sealed state.

To make the case 6 compact, its outside shape matches, for example, the outside shape of the circuit board 1 (for example, a rectangular parallelepiped shape). The length of the case 6 in the front-back direction (X-axis direction) is set to the sum of the length of the second circuit board part 1b in the front-back direction and a predetermined margin. The length of the case 6 in the up-down direction (Z-axis direction) is set to the sum of the length of the first circuit board part 1a in the up-down direction and a predetermined margin. That is, the length of the case 6 in the up-down direction is shorter than its length in the front-back direction.

As the material of the case 6, a metal member (for example, an aluminum material) is used to, for example, prevent a reflected wave from the cover member B from entering the case 6, improve a property to dissipate heat from the circuit board 1, and improve electromagnetic compatibility (EMC) performance. When reduction in cost and weight is emphasized, however, a resin may be used as the material of the case 6. Alternatively, the case 6 and dielectric lens 7 may be integrally formed from the same resin material. However, the case 6 is preferably formed from a material having higher thermal conductivity than the material of the dielectric lens 7.

The opening 6a, through which electromagnetic waves are sent from the transmission antenna 2 and received by the reception antenna 3, is formed at the front of the case 6. The dielectric lens 7 is attached in the opening 6a. The diameter of the opening 6a is set to, for example, the length of an opening from which a predetermined gain is obtained when an electromagnetic wave is sent or received (that is, a beam width when an electromagnetic wave is sent from the transmission antenna 2).

The dielectric lens 7, which is supported in front of the circuit board 1, narrows the beam of an electromagnetic wave sent from the transmission antenna 2 and directs the narrowed beam to an outside region in front of the radar device U. The dielectric lens 7 focuses a reflected wave, which is the electromagnetic wave that had been sent and has returned from the target, onto the reception antenna 3. In other words, the transmission antenna 2 and reception antenna 3 are each placed at the focal point of the dielectric lens 7. The dielectric lens 7 is structured so as to narrow the electromagnetic wave sent from the transmission antenna 2 to the extent that the electromagnetic wave is converted to a plane wave.

The dielectric lens 7 improves a gain at the time when the transmission antenna 2 sends electromagnetic waves and when the reception antenna 3 receives the electromagnetic waves, and also functions as a radome that protects the transmission antenna 2 and reception antenna 3. The dielectric lens 7 restrains reflected waves from the cover member B from entering the reception antenna 3.

The dielectric lens 7 according to this embodiment is, for example, a semi-cylindrical or parabolic cylindrical lens that is convex in the positive X direction. The dielectric lens 7 extends in the Y-axis direction (that is, along the direction in which the antenna elements 2a to 2d and antenna elements 3a to 3d are placed into an array).

Since the dielectric lens 7 is semi-cylindrical or parabolic cylindrical, the cross-section of its side has almost the same shape at any position in the Y-axis direction. Therefore, when electromagnetic waves sent from a plurality of antenna elements, 2a to 2d, constituting the transmission antenna 2, which are placed along the Y-axis direction, are reflected at the target and reach the reception antenna 3, it is possible to restrain these electromagnetic waves from being oriented in mutually different directions (see FIG. 4). Therefore, it is possible to restrain precision in object detection from being lowered due to mutual interference of reflected waves or a change in phase difference.

There is no limitation on the material of the dielectric lens 7. For example, an acrylic resin, a tetrafluoroethylene resin, a polystyrene resin, a polycarbonate resin, a polybutylene terephthalate resin, a polyphenylene resin, a polypropylene resin, a syndiotactic polystyrene resin, an acrylonitrile-butadiene-styrene (ABS) resin, or the like is used.

Effects

As described above, the radar device U according to this embodiment has a plurality of antenna elements, 2a to 2d and 3a and 3d, which are placed into an array on a component side of the first circuit board part 1a of the circuit board 1, the component side being close to the front of the radar device U, in a direction crossing the forward direction of the radar device U. The radar device U also has the transmission antenna 2 that sends electromagnetic waves to the outside the case 6 through the opening 6a and the reception antenna 3 that receives, through the opening 6a, reflected waves of the electromagnetic waves sent from the transmission antenna 2 (typically, the transmission antenna 2 and reception antenna 3 are each a phased array antenna composed of a plurality of patch antennas). The radar device U also has the dielectric lens 7 in a semi-cylindrical or parabolic cylindrical shape that is convex in the forward direction, the dielectric lens 7 being placed in the opening 6a in the case 6 so as to extend along the direction in which the plurality of antenna elements, 2a to 2d and 3a to 3d, are placed into an array.

Therefore, the radar device U according to this embodiment can improve an antenna gain and bearing discrimination in direction inference in spite of the radar device U being horizontally mounted. In addition, the radar device U used in the dielectric lens 7 in a semi-cylindrical shape restrains electromagnetic waves sent from a plurality of antenna elements, 2a to 2d, from causing mutual interference, which would otherwise lower radar performance.

With the radar device U according to this embodiment, the dielectric lens 7 can also function as a radome. Therefore, it is possible to protect the transmission antenna 2 and reception antenna 3 from water and flying objects without having to provide a separate radome. This makes it possible to reduce the area of the antenna opening when compared with a case in which a separate radome is provided.

With the radar device U according to this embodiment, even if electromagnetic waves sent from the transmission antenna 2 are reflected on the cover member B, the dielectric lens 7 can reflect the reflected waves in a direction away from the transmission antenna 2 and reception antenna 3. Since the radar device U is horizontally mounted, an area itself can be restricted through which reflected waves from the cover member B may enter the case 6. Therefore, it is possible to restrain precision in object detection from being lowered by reflected waves from the cover member B.

In the radar device U according to this embodiment, the signal processing IC 4a electrically connected to the transmission antenna 2 and the signal processing IC 4b electrically connected to the reception antenna 3 are mounted on the rear component side of the first circuit board part 1a. Thus, it is possible to shorten the lengths of the wires between the transmission antenna 2 and the signal processing IC 4a and between the reception antenna 3 and the signal processing IC 4b. Therefore, it is possible to suppress the warp of the waveforms of analog signals in the wires, contributing to improving a signal-to-noise (S/N) ratio. It is also possible to reduce loss in electric power in the wires.

Second Embodiment

Next, an example of the structure of a radar device U according to a second embodiment will be described with reference to FIG. 6.

Figure 6:
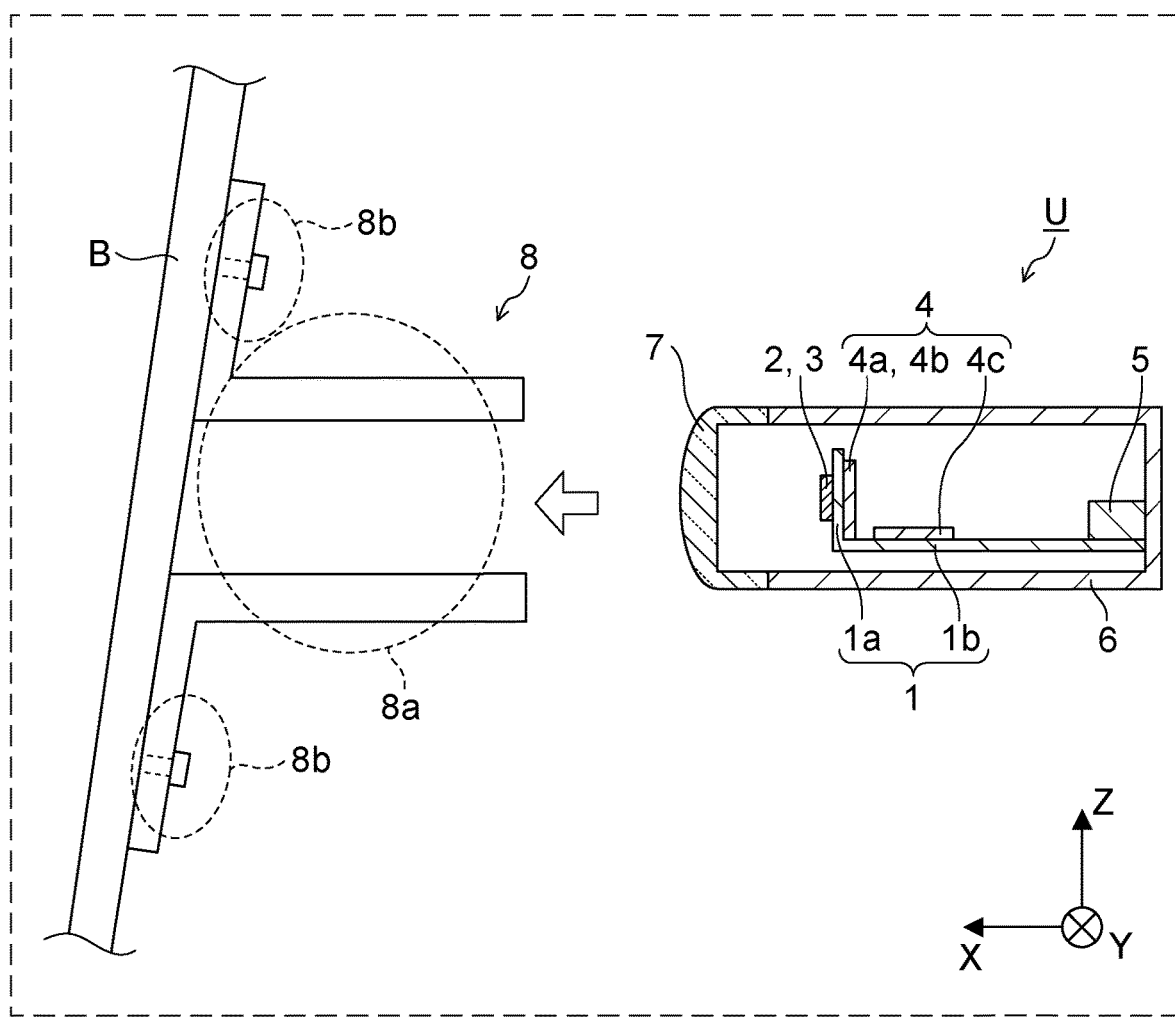
FIG. 6 is a sectional side elevation of the radar device according to a second embodiment.

FIG. 6 is a sectional side elevation of the radar device U according to the second embodiment.

The radar device U according to this embodiment differs from the radar device U according to the first embodiment in that the radar device U according to this embodiment has a bracket 8 that secures the case 6 and the like to the cover member B. Descriptions of structures common to the first embodiment and second embodiment will be omitted (this is also true for other embodiments described below).

The bracket 8 secures the case 6 to the cover member B to define a direction in which the radar device U sends and receives electromagnetic waves.

The bracket 8 has, for example, a storage portion 8a in which the radar device U is stored and fixing portions 8b secured to the cover member B.

The storage portion 8a has, for example, a cylindrical shape that enables the case 6 and dielectric lens 7 to be inserted into the storage portion 8a from the front of the radar device U (that is, from the surface on which the dielectric lens 7 is attached). In the storage portion 8a, storage space matching the outside shape of the case 6 is formed. The storage portion 8a has an opening through which the radar device U sends and receives electromagnetic waves, the opening being formed in a region at which the dielectric lens 7 at the front of the radar device U is placed.

Each fixing portion 8b is secured to the cover member B with a double-sided adhesive tape or bolts, by ultrasonic welding, or in any other way.

The bracket 8 having a structure described above retains the case 6 to the cover member B so that, for example, a direction in which the radar device U sends and receives electromagnetic waves is parallel to the ground. Thus, it is possible to detect a target present around the vehicle C.

The structure of the bracket 8 may have an adjustment mechanism (that uses, for example, a pin joint and a fixing pin) that can vary the angle of a direction in which electromagnetic waves are sent and received. When the adjustment mechanism is used, fine adjustment of the direction in which electromagnetic waves are sent and received is also possible.

With the radar device U according to this embodiment, mechanical stability can be maintained and electromagnetic waves can be sent and received in a desired direction (for example, a direction parallel to the ground).

Third Embodiment

Next, an example of the structure of a radar device U according to a third embodiment will be described with reference to FIG. 7.

Figure 7:
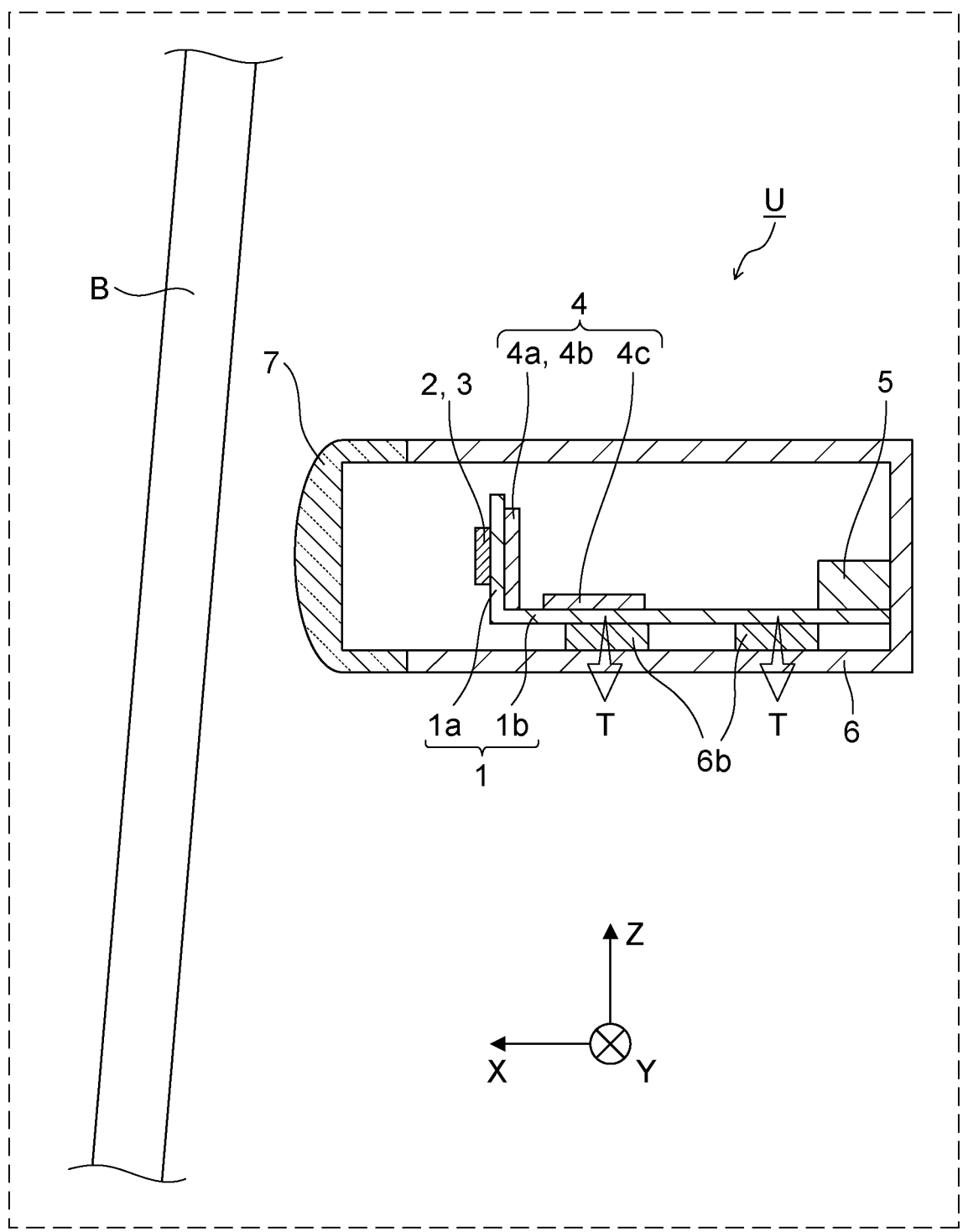
FIG. 7 is a sectional side elevation of the radar device according to a third embodiment.

FIG. 7 is a sectional side elevation of the radar device U according to the third embodiment.

The radar device U according to this embodiment differs from the radar device U according to the first embodiment in that the radar device U according to this embodiment has connecting parts 6b that thermally bond the case 6 to the circuit board 1 or circuit components mounted on the circuit board 1.

FIG. 7 illustrates a state in which the connecting parts 6b thermally bond the wall of the case 6 to the circuit board 1. Each hallow arrow T in the drawing represents a flow of heat from the circuit board 1.

In this embodiment, a metal member having a high heat dissipation property, for example, is used as the material of the case 6. Each connecting part 6b thermally bonds the wall of the case 6 to the circuit board 1 or circuit components mounted on the circuit board 1.

The connecting part 6b can have any structure. The connecting part 6b may be formed integrally with the wall of the case 6. Alternatively, the connecting part 6b may be formed from, for example, silicone grease or an adhesive based on an epoxy resin or the like. Alternatively, the connecting part 6b may be a putty-, rubber-, gell-, or compound-like member.

With the radar device U according to the present disclosure, the entire region of the case 6 except the front can be formed as a wall region that can dissipate heat. Therefore, the wall region, capable of dissipating heat, of the case 6 can be made large. Accordingly, in the improvement of a property to dissipate heat from the circuit board 1, the structure in which the connecting parts 6b are used to dissipate heat from the case 6 is especially effective in the radar device U according to the present disclosure.

The radar device U according to this embodiment can improve a property to dissipate heat from the circuit board 1 and the like.

Fourth Embodiment

Next, an example of the structure of a radar device U according to a fourth embodiment will be described with reference to FIGS. 8 and 9.

Figure 8:
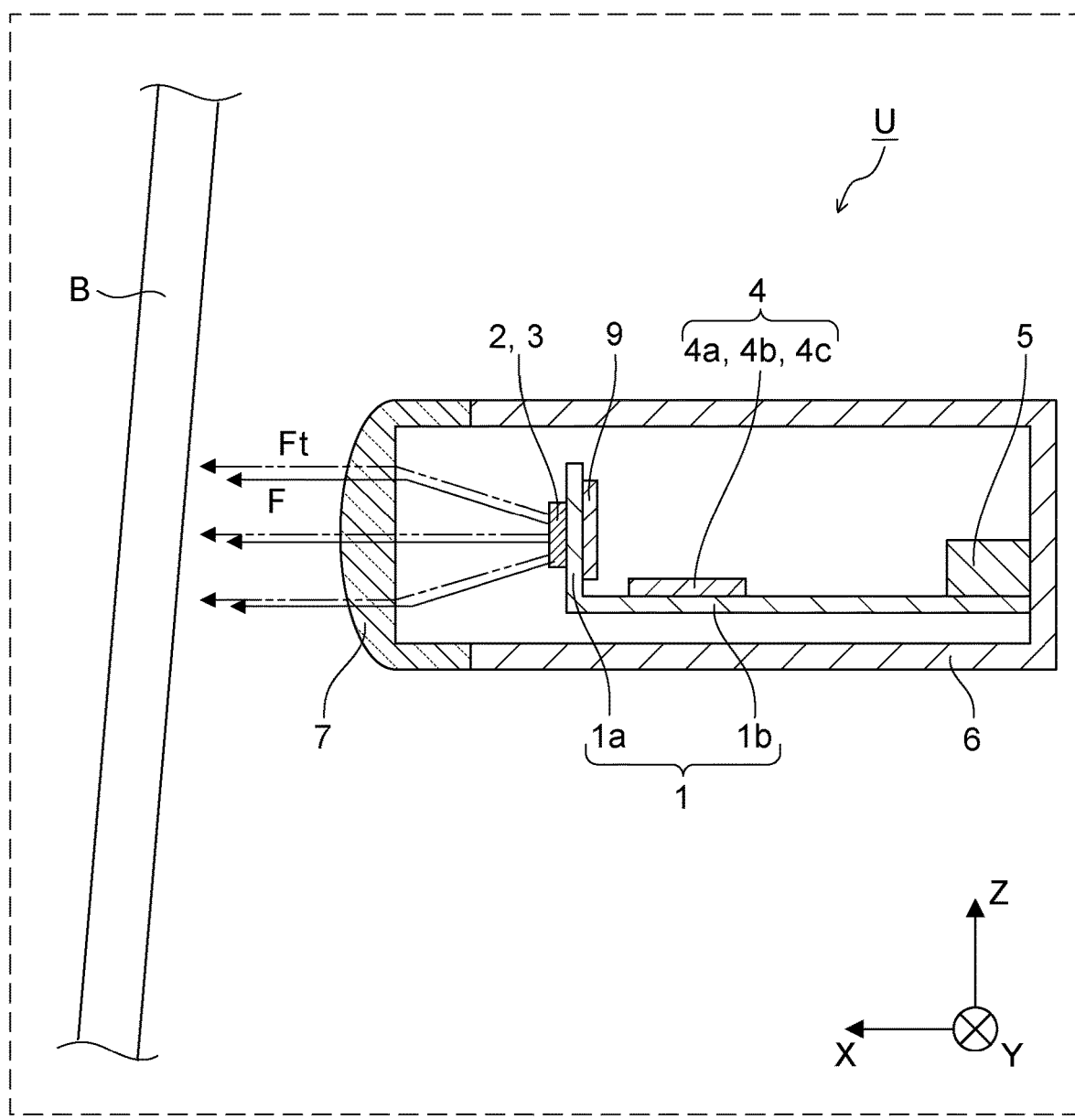
FIG. 8 is a sectional side elevation of the radar device according to a fourth embodiment.

FIG. 8 is a sectional side elevation of the radar device U according to the fourth embodiment. FIG. 9 is a front view of the radar device U according to the fourth embodiment when the front component side of the first circuit board part 1a is viewed from in front of the first circuit board part 1a.

The radar device U according to this embodiment differs from the radar device U according to the first embodiment in that on the first circuit board part 1a, a reflector 9 is placed on the side opposite to the side on which the transmission antenna 2 is mounted, (that is, on the rear component side of the first circuit board part 1a).

On the same side as the rear surface of the transmission antenna 2, the reflector 9 reflects the back lobes of electromagnetic waves sent from the transmission antenna 2. Thus, the direction in which the back lobes of the electromagnetic waves sent from the transmission antenna 2 proceed is changed to the forward direction. Each back lobe is then combined with the main lobe F of the relevant electromagnetic wave sent from the transmission antenna 2 (see the arrows Ft indicated by dash-dot-dot lines in FIG. 8).

The reflector 9 may be formed by attaching a metal plate to the rear component side of the first circuit board part 1a. Alternatively, when a multi-layer circuit board is used as the first circuit board part 1a, the reflector 9 may be formed as an intermediate conductor layer of the multi-layer circuit board or an conductor layer on the rear surface of the multi-layer circuit board.

Figure 9:
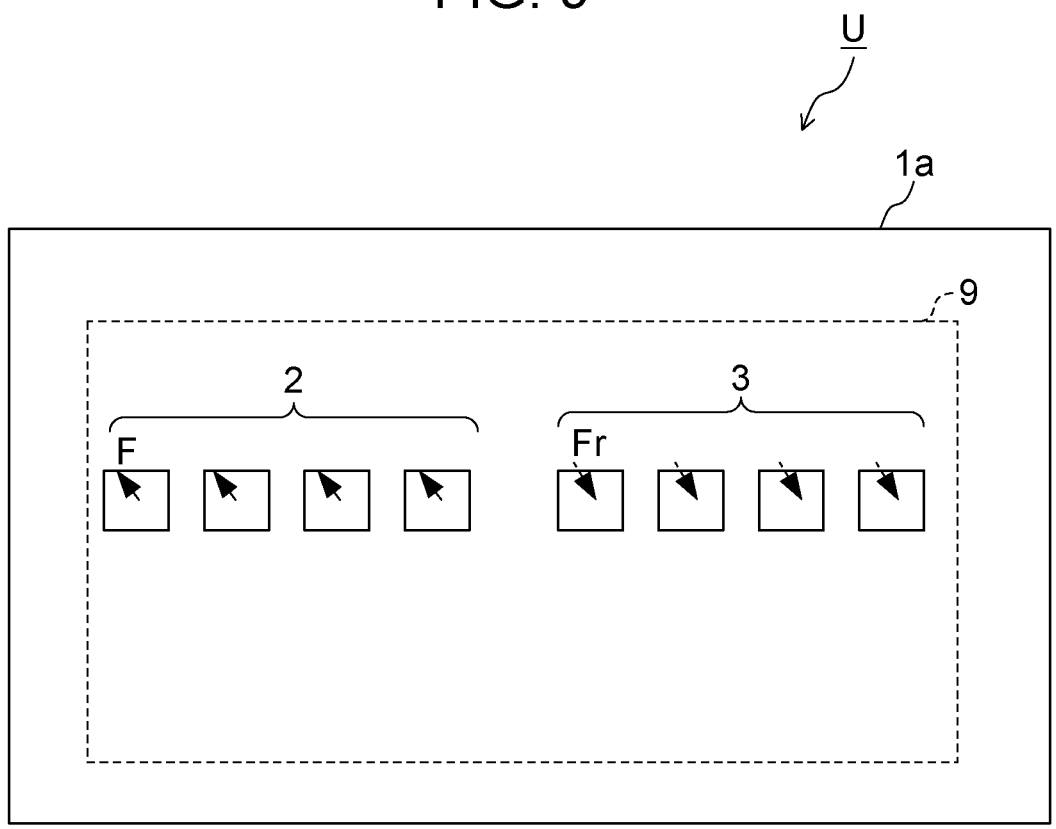
FIG. 9 is a front view of the radar device according to the fourth embodiment.

The reflector 9 is placed at a position at which the reflector 9 covers the entire regions of the rear surfaces of the transmission antenna 2 and reception antenna 3 on the first circuit board part 1a (see FIG. 9). When placed on the rear surface of the reception antenna 3, the reflector 9 has the effect of increasing the reception efficiency.

Alternatively, the reflector 9 is placed at a distance of about λg/4 from the position of the transmission antenna 2 so that the phase of the back lobe Ft that is reflected on the reflector 9 and proceeds forward substantially matches the phase of the main lobe F. Here, λg represents the equivalent wavelength of an electromagnetic wave when it passes through the circuit board 1. The value of λg is obtained from the equation λg=λ0/sqrt(er), where λ0/ is the free-space wavelength of the electromagnetic wave sent from the transmission antenna 2 and er is the specific inductive capacity of the circuit board 1.

The radar device U according to this embodiment can further improve the gain.

Fifth Embodiment

Next, an example of the structure of a radar device U according to a fifth embodiment will be described with reference to FIG. 10.

Figure 10:
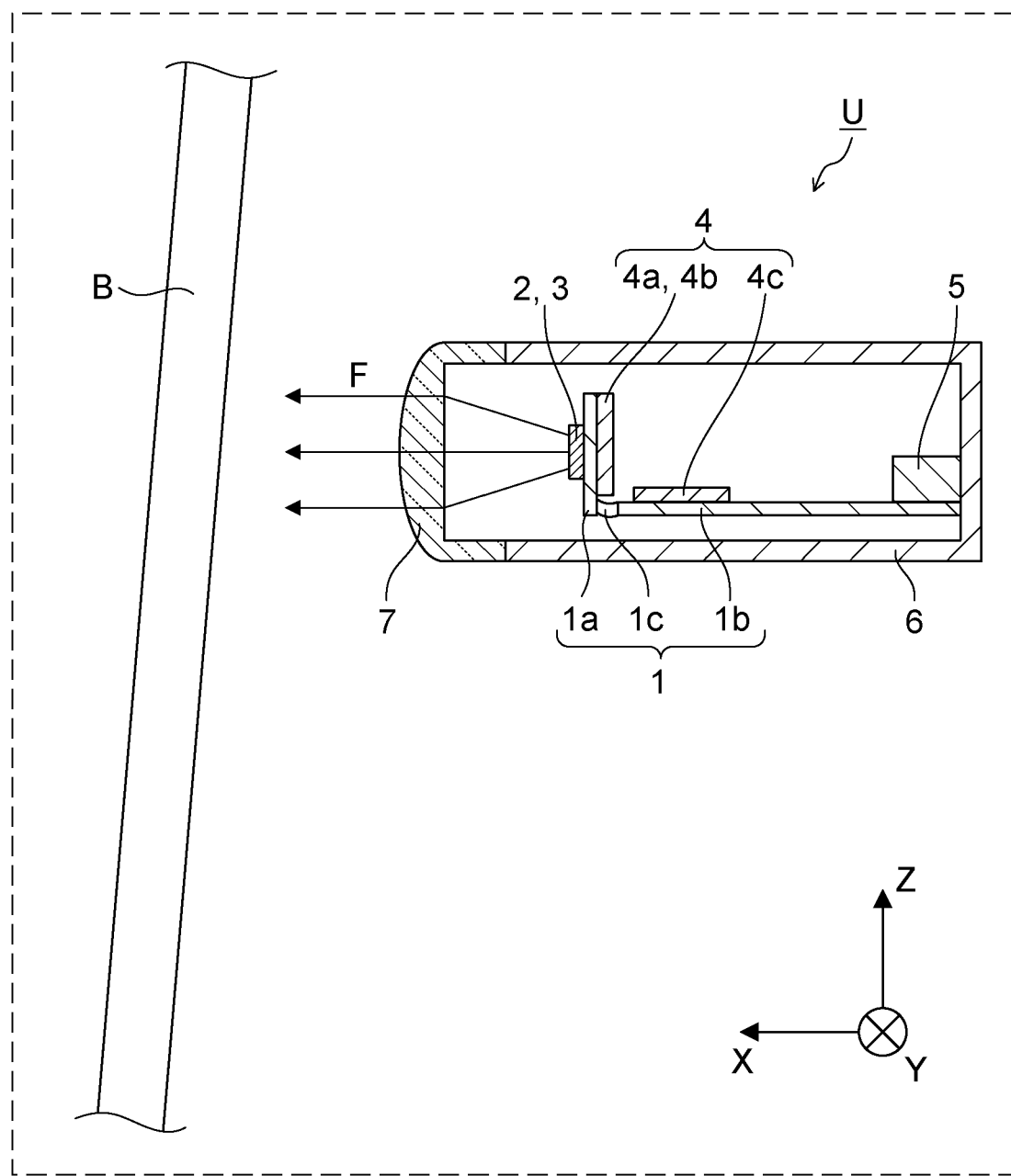
FIG. 10 is a sectional side elevation of a radar device according to a fifth embodiment.

FIG. 10 is a sectional side elevation of the radar device U according to the fifth embodiment.

The radar device U according to this embodiment differs from the radar device U according to the first embodiment in that the first circuit board part 1a and second circuit board part 1b are placed separately from each other and are electrically connected to each other through a flexible wiring board 1c.

The flexible wiring board 1c is a flexible circuit board on which wires are formed as patterns. The flexible wiring board 1c electrically connects the wires of the first circuit board part 1a and the wires of the second circuit board part 1b to each other.

In other words, the signal processing IC 4a and signal processing IC 4b placed on the rear component side of the first circuit board part 1a send and receive electric signals to and from the signal processing IC 4c through the flexible wiring board 1c.

Since the radar device U according to this embodiment uses the flexible wiring board 1c, the radar device U can more flexibly adjust the positions at which to place the first circuit board part 1a and second circuit board part 1b by adjusting their positions in the Z direction.

Sixth Embodiment

Figure 11:
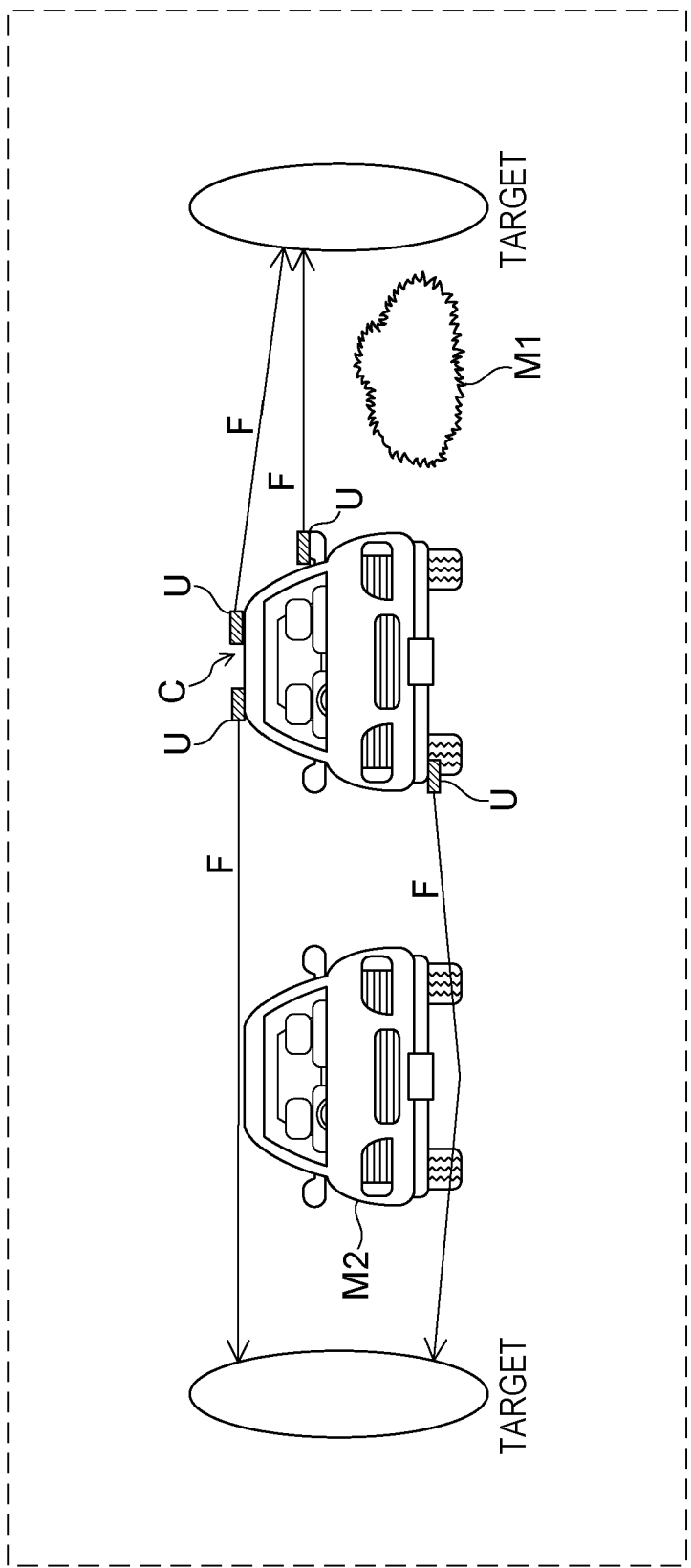
FIG. 11 illustrates an example of positions at which a radar a device according to a six embodiment is mounted.

FIG. 11 illustrates an example of positions at which a radar device U according to a sixth embodiment is mounted.

This embodiment differs from the embodiments described above in that the radar devices U is mounted on the top of the vehicle C, on the bottom of the vehicle C, or on a side mirror of the vehicle C. In FIG. 11, four radar devices U are mounted.

Since the radar in the related art is required to be mounted inside a bumper so that the external appearance of the vehicle is not impaired, a height in mounting has been limited to about 30 cm to 60 cm. Therefore, there has been a case in which electromagnetic wave transmission is hindered by an obstacle in the vicinity of the vehicle and a detection range is thereby restricted.

Since the radar device U in the present disclosure is horizontally mounted, however, only a small area is occupied in the up-down direction by the radar device U and it is unnoticeable from the outside. In this embodiment, therefore, the radar device U is mounted on the top of the vehicle C or on the bottom of the vehicle C.

The radar device U mounted on the top of the vehicle C can send electromagnetic waves to a distance without being hindered by an object M1 (such as, for example, a hedge) on the road. That is, the radar device U can detect a target (such as, for example, a person or conveyance) beyond the object M1. A similar effect can be expected for the radar device U mounted on a side mirror of the vehicle C.

The radar device U mounted on the bottom of the vehicle C can send electromagnetic waves so as to pass through space between the road and the body of another vehicle M2. Therefore, the radar device U can send electromagnetic waves to a distance without being hindered by the other vehicle M2. That is, the radar device U can detect a target (such as, for example, a person or conveyance) beyond the other vehicle M2.

As described above, the radar device U according to this embodiment can send electromagnetic waves without being hindered by another object. Therefore, not only can the S/N ratio be improved, but a target in an area at a greater distance can be detected.

Seventh Embodiment

Figure 12:
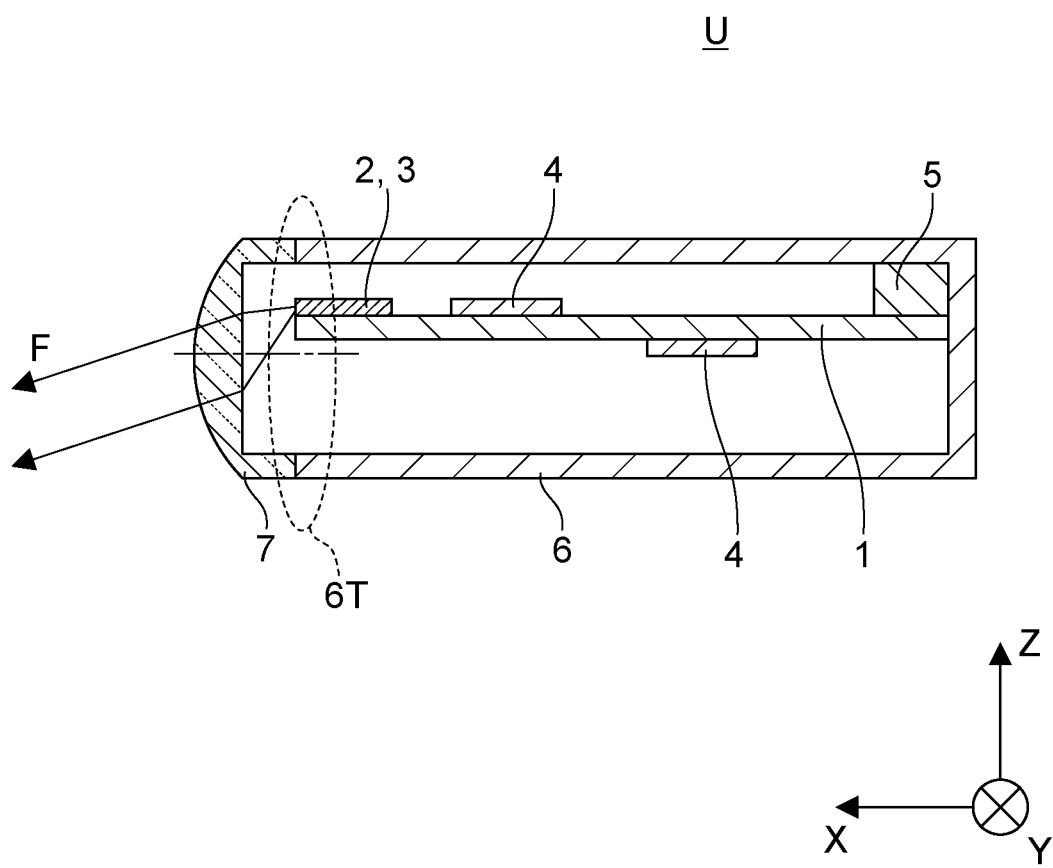
FIG. 12 is a sectional side elevation illustrating a structure of a radar device according to a seventh embodiment.

FIGS. 12 and 13 are each a sectional side elevation illustrating the structure of a radar device U according to a seventh embodiment.

The radar device U according to this embodiment differs from the radar device U according to the first embodiment in that electromagnetic waves are sent from the antenna section (composed of the transmission antenna 2 and reception antenna 3) in a direction inclined with respect to the X-axis direction, which is one of the directions in which the circuit board 1 extend (that is, the direction in which the case 6 extends).

FIG. 12 illustrates an aspect in which, in the case 6, the antenna section (composed of the transmission antenna 2 and reception antenna 3) is placed above the optical axis of the dielectric lens 7 and sends electromagnetic waves in a direction inclined downward with respect to the direction in which the circuit board 1 extends. FIG. 13 illustrates an aspect in which, in the case 6, the antenna section (composed of the transmission antenna 2 and reception antenna 3) is placed below the optical axis of the dielectric lens 7 and sends electromagnetic waves in a direction inclined upward with respect to the direction in which the circuit board 1 extends.

That is, in these aspects, the direction in which electromagnetic waves are sent is inclined upward or downward with respect to the direction in which the case 6 extends.

The radar device U in this embodiment is preferable particularly in the aspect described in the sixth embodiment (see FIG. 11). Specifically, if the radar device U is mounted on the top of the vehicle C, when the transmission direction of electromagnetic waves is inclined downward as illustrated in FIG. 12, a downward field of view can be formed without having to change the orientation of the case 6. If the radar device U is mounted on the bottom of the vehicle C, when the transmission direction of electromagnetic waves is inclined upward as illustrated in FIG. 13, reflection of electromagnetic waves on the road can be suppressed.

The dielectric lens 7 according to this embodiment may be of a type in which the direction of the optical axis is inclined with respect to the direction in which the circuit board 1 extends or may be of a type in which the refractive index of the dielectric lens 7 differs between its upward and downward portions with respect to the optical axis.

Other Embodiments

The present disclosure is not limited to the above embodiments but various modified aspects are possible.

In the embodiments described above, an aspect has been described in which the component sides of the first circuit board part 1a extend in the up-down direction and the component sides of the second circuit board part 1b extend in the front-back direction, as an example of the circuit board 1. In the present disclosure, however, the component sides of the first circuit board part 1a may extend in a direction inclined from the up-down direction toward the positive X direction or negative X direction. Similarly, the component sides of the second circuit board part 1b may extend in a direction inclined from the front-back direction toward the positive Z direction or negative Z direction.

In the embodiments described above, a vehicle has been taken as an example of a target to which the radar device U is applied. However, the radar device U according to the present disclosure can be applied to any target; for example, the radar device U can also be applied to machines having rotating vanes such as a helicopter or to a robot.

So far, specific examples of the present disclosure have been described in detail. However, these example are merely exemplary of the present disclosure and do not restrict the scope of claims. Technologies described in the scope of claims include various modifications and changes of the above specific examples.

The present disclosure can be realized by software, hardware, or software in cooperation with hardware.

Each functional block used in the description of each embodiment described above can be partly or entirely realized by an LSI circuit such as an integrated circuit, and each process described in the each embodiment may be controlled partly or entirely by the same LSI circuit or a combination of LSI circuits. The LSI circuit may be individually formed as chips, or one chip may be formed so as to include a part or all of the functional blocks. The LSI circuit may include a data input and output coupled thereto. The LSI circuit here may be referred to as an IC, a system LSI circuit, a super LSI circuit, or an ultra LSI circuit depending on a difference in the degree of integration.

However, the technique of implementing an integrated circuit is not limited to the LSI circuit and may be realized by using a dedicated circuit, a general-purpose processor, or a special-purpose processor. In addition, field programmable gate array (FPGA) that can be programmed after the manufacture of the LSI circuit or a reconfigurable processor in which the connections and the settings of circuit cells disposed inside the LSI circuit can be reconfigured may be used. The present disclosure can be realized as digital processing or analogue processing.

If future integrated circuit technology replaces LSI circuits as a result of the advancement of semiconductor technology or other derivative technology, the functional blocks could be integrated using the future integrated circuit technology. Biotechnology can also be applied.

The radar device according to the present disclosure can achieve a high antenna gain and high bearing discrimination in spite of the radar device being horizontally mounted.

What is claimed is:

1. A radar device comprising:
   a case having an opening at a front of the case in a forward direction, which is a transmission direction of an electromagnetic wave;
   a circuit board placed in the case, the circuit board having a first circuit board part and a second circuit board part, one component side of the first circuit board part being oriented in the forward direction, component sides of the second circuit board part extending along the forward direction;
   an antenna section composed of a plurality of antenna elements placed on the one component side, oriented in the forward direction, of the first circuit board part, the plurality of antenna elements being placed into an array in a direction crossing the forward direction, the antenna section sending an electromagnetic wave to an outside of the case through the opening, the antenna section receiving a reflected wave of the electromagnetic wave; and
   a dielectric lens that is a semi-cylindrical or parabolic cylindrical lens having a convex shape in the forward direction, the dielectric lens being placed in the opening in the case so as to extend along a direction in which the plurality of antenna elements are placed into an array.

2. The radar device according to claim 1, wherein each of the plurality of antenna elements is implemented by a conductor pattern formed on the circuit board.

3. The radar device according to claim 2, wherein the each of the plurality of antenna elements is a patch antenna.

4. The radar device according to claim 1, further comprising a signal processor that controls a phase of the electromagnetic wave sent from each of the plurality of antenna elements to change the transmission direction of the electromagnetic wave to be sent to the outside of the case.

5. The radar device according to claim 4, wherein the signal processor is mounted on a rear component side of the first circuit board part, the signal processor being electrically connected to the antenna section.

6. The radar device according to claim 1, further comprising a reflector that reflects a back lobe of the electromagnetic wave sent from the antenna section, the reflector being placed on a component side of the first circuit board part, the component side being opposite to a component side, of the first circuit board part, on which the antenna section is mounted.

7. The radar device according to claim 1, wherein the first circuit board part is placed closer to a front in the forward direction than is a midpoint of the component sides of the second circuit board part in a front-back direction.

8. The radar device according to claim 1, wherein a length of the case in a front-back direction corresponding to the transmission direction of the electromagnetic wave is longer than a length of the case in an up-down direction corresponding to a direction normal to component sides of the circuit board.

9. The radar device according to claim 1, wherein the case has a connecting part that thermally bonds the case to the circuit board or to a circuit component mounted on the circuit board.

10. The radar device according to claim 1, wherein the electromagnetic wave is sent through a cover member placed outside the dielectric lens, the cover member covering an area in front of the case.

11. The radar device according to claim 1, wherein the radar device is supported so that the forward direction, which is the transmission direction of the electromagnetic wave, is parallel to ground.

12. The radar device according to claim 1, wherein, with respect to an upward direction and a downward direction that are orthogonal to a direction in which the circuit board extend, the antenna section is placed in the case so as to deviate from an optical axis of the dielectric lens in the upward direction and sends the electromagnetic wave in a direction inclined downward with respect to the direction in which the circuit board extends.

13. The radar device according to claim 1, wherein, with respect to an upward direction and a downward direction that are orthogonal to a direction in which the circuit board extend, the antenna section is placed in the case so as to deviate from an optical axis of the dielectric lens in the downward direction and sends the electromagnetic wave in a direction inclined upward with respect to the direction in which the circuit board extends.

14. The radar device according to claim 1, wherein the radar device is mounted in a vehicle.

15. The radar device according to claim 14, wherein the radar device is mounted on a top of a vehicle.

16. The radar device according to claim 15, wherein the radar device is mounted on a bottom of a vehicle.

* * * * *